(12) United States Patent
Heo et al.

(10) Patent No.: US 10,964,753 B2
(45) Date of Patent: Mar. 30, 2021

(54) OPTOELECTRONIC DEVICE INCLUDING A METAL LAYER PATTERN INCLUDING A METAL HAVING A NEGATIVE DIELECTRIC CONSTANT AND IMAGE SENSOR AND ELECTRONIC DEVICE INCLUDING THE SAME

(71) Applicant: Samsung Electronics Co., Ltd., Suwon-si (KR)

(72) Inventors: Sung Heo, Suwon-si (KR); Takkyun Ro, Hwaseong-si (KR); Kyung Bae Park, Hwaseong-si (KR); Gyeongsu Park, Hwaseong-si (KR); Joo Ho Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/398,947

(22) Filed: Apr. 30, 2019

(65) Prior Publication Data
US 2019/0341427 A1 Nov. 7, 2019

(30) Foreign Application Priority Data
May 2, 2018 (KR) .......................... 10-2018-0050713

(51) Int. Cl.
*H01L 29/08* (2006.01)
*H01L 27/30* (2006.01)
(Continued)

(52) U.S. Cl.
CPC ........ *H01L 27/307* (2013.01); *H01L 51/0023* (2013.01); *H01L 51/4286* (2013.01);
(Continued)

(58) Field of Classification Search
CPC .............. H01L 27/307; H01L 51/0023; H01L 51/4286; H01L 51/5209; H01L 51/5212;
(Continued)

(56) References Cited

U.S. PATENT DOCUMENTS 8,525,174 B2 * 9/2013 You .................. H01L 27/1214
257/59
8,912,083 B2 * 12/2014 Liu ..................... H01L 31/068
438/559

(Continued)

FOREIGN PATENT DOCUMENTS

KR 20170087049 A 7/2017

OTHER PUBLICATIONS

Sung Heo et al., "Scientific Reports: Device Performance Enhancement via a Si-rich Silicon Oxynitride Buffer Layer for the Organic Photodetecting Device," pp. 1-6, Published May 4, 2017.
(Continued)

*Primary Examiner* — Caleb E Henry
(74) *Attorney, Agent, or Firm* — Harness, Dickey & Pierce, P.L.C.

(57) ABSTRACT

Disclosed is an optoelectronic device including a first electrode and a second electrode facing each other; a metal layer pattern disposed between the first electrode and the second electrode; a buffer layer covering the metal layer pattern; and a photoelectric conversion layer on the buffer layer. The metal layer pattern includes a metal having a negative dielectric constant and the buffer layer includes a compound selected from silicon nitride ($SiN_x$, $0<x<1$), silicon oxynitride ($SiO_yN_z$, $0<y<0.5$, $0<z\leq1$), P-doped silicon oxynitride ($SiO_yN_z$:P, $0<y<0.5$, $0<z\leq1$), and a combination thereof.

22 Claims, 9 Drawing Sheets

(51) Int. Cl.
*H01L 51/00* (2006.01)
*H01L 51/52* (2006.01)
*H01L 51/42* (2006.01)
*H01L 51/44* (2006.01)

(52) U.S. Cl.
CPC ...... *H01L 51/5209* (2013.01); *H01L 51/5212* (2013.01); *H01L 51/442* (2013.01); *H01L 51/5234* (2013.01)

(58) Field of Classification Search
CPC . H01L 51/5234; H01L 51/442; H01L 51/441; Y02E 10/549
USPC .......................................................... 257/40
See application file for complete search history.

(56) References Cited

U.S. PATENT DOCUMENTS

| | | | |
|---|---|---|---|
| 9,508,874 B2 | 11/2016 | Buller et al. | |
| 10,403,695 B2* | 9/2019 | Bang | H01L 27/3246 |
| 2007/0175508 A1* | 8/2007 | Park | H01L 31/02168 |
| | | | 136/256 |
| 2008/0001243 A1* | 1/2008 | Otake | H01L 31/035281 |
| | | | 257/437 |
| 2008/0001864 A1* | 1/2008 | Lee | H01L 51/5246 |
| | | | 345/82 |
| 2010/0200883 A1* | 8/2010 | Sato | H01L 51/002 |
| | | | 257/98 |
| 2010/0252109 A1* | 10/2010 | Hong | H01L 31/022425 |
| | | | 136/261 |
| 2011/0309339 A1* | 12/2011 | You | H01L 51/5218 |
| | | | 257/40 |
| 2012/0007057 A1* | 1/2012 | Choi | H01L 51/56 |
| | | | 257/40 |
| 2012/0298984 A1* | 11/2012 | Park | H01L 27/1225 |
| | | | 257/43 |
| 2013/0119387 A1* | 5/2013 | Park | H01L 27/32 |
| | | | 257/59 |
| 2014/0057386 A1* | 2/2014 | Hwang | H01J 37/32706 |
| | | | 438/88 |
| 2014/0061603 A1* | 3/2014 | Kim | H01L 51/5253 |
| | | | 257/40 |
| 2014/0353600 A1* | 12/2014 | Hong | H01L 27/3276 |
| | | | 257/40 |
| 2017/0207275 A1* | 7/2017 | Heo | H01L 51/5092 |

OTHER PUBLICATIONS

Su-Hun Jeong et al., "Silver-Based Nanoparticles for Surface Plasmon Resonance in Organic Optoelectronics," pp. 1-12, 2014 Wiley-Vch Verlag GmbH & Co. KGaA, Weinheim.

Peng Xu et al., "The Role of AG Nanoparticles in Inverted Polymer Solar Cells: Surface Plasmon Resonance and Backscattering Centers," pp. 1-5, dated Nov. 24, 2014, Published by the AIP Publishing.

Farid Jamali-Sheini et al., "SnS Nanosheet Films Deposited via Thermal Evaporation: The Effects of Buffer Layers on Photovoltaic Performance," Dated May 5, 2016, pp. 49-56.

Mei-Feng Xu et al., "Plasmon Resonance Enhanced Optical Absorption in Inverted Polymer/Fullerene Solar Cells with Metal Nanoparticle-Doped Solution-Processable TiP2 Layer," American Chemical Society 2013, pp. 2935-2942.

* cited by examiner

OPTOELECTRONIC DEVICE INCLUDING A METAL LAYER PATTERN INCLUDING A METAL HAVING A NEGATIVE DIELECTRIC CONSTANT AND IMAGE SENSOR AND ELECTRONIC DEVICE INCLUDING THE SAME

CROSS REFERENCE TO RELATED APPLICATION

This application claims priority to and the benefit of Korean Patent Application No. 10-2018-0050713 filed in the Korean Intellectual Property Office on May 2, 2018, the entire contents of which are incorporated herein by reference.

BACKGROUND

1. Field

Example embodiments relate to an optoelectronic device, and an image sensor and an electronic device including the same.

2. Description of the Related Art

An optoelectronic device is a device requiring a charge exchange between an electrode and a photoelectric conversion layer by using holes or electrons.

An optoelectronic device may be classified as follows in accordance with its driving principles. A first optoelectronic device is an electronic device driven as follows: excitons are generated in a photoelectric conversion layer by photons from an external light source; the excitons are separated into electrons and holes; and the electrons and holes are transferred to different electrodes as a current source (voltage source). A second optoelectronic device is an electronic device driven as follows: a voltage or a current is applied to at least two electrodes to inject holes and/or electrons into a photoelectric conversion layer positioned at an interface of the electrodes, and the device is driven by the injected electrons and holes.

The optoelectronic device has a structure in which a photoelectric conversion layer including a functional inorganic or organic material is interposed between an anode and a cathode. The optoelectronic device may include a buffer layer (e.g. a hole injection layer (HIL), a hole transport layer (HTL), an electron transport layer (ETL), and an electron injection layer (EIL)) between an anode and a photoelectric conversion layer or a cathode and a photoelectric conversion layer, in order to improve efficiency and stability.

Research has been actively conducted to improve optical absorbance to improve the efficiency of the optoelectronic device.

SUMMARY

Example embodiments provide an optoelectronic device with improved optical absorbance and efficiency.

Example embodiments also provide an image sensor including the optoelectronic device.

Example embodiments also provide an electronic device including the image sensor.

According to example embodiments, an optoelectronic device includes a first electrode and a second electrode facing each other; a metal layer pattern between the first electrode and the second electrode; a buffer layer covering the metal layer pattern; and a photoelectric conversion layer on the buffer layer. The metal layer pattern includes a metal having a negative dielectric constant and the buffer layer includes a compound selected from silicon nitride ($SiN_x$, $0<x<1$), silicon oxynitride ($SiO_yN_z$, $0<y<0.5$, $0<z\leq1$), P-doped silicon oxynitride ($SiO_yN_z$:P, $0<y<0.5$, $0<z\leq1$), and a combination thereof.

In some embodiments, the metal layer pattern may include a metal selected from Ag, Au, Co, Cu, an alloy thereof, and a mixture thereof.

In some embodiments, the metal layer pattern may have a shape selected from a cylinder, a block, and a hemisphere.

In some embodiments, the metal layer pattern may include a metal and the metal may have a dielectric constant of about −12 to about −0.1.

In some embodiments, the metal layer pattern may have a pattern size of about 5 nm to about 500 nm.

In some embodiments, the buffer layer may include a compound selected from silicon nitride ($SiN_x$, $0.2\leq x\leq0.7$), silicon oxynitride ($SiO_yN_z$, $0.05\leq y\leq0.35$, $0.2\leq z\leq0.7$), and a combination thereof.

In some embodiments, the compound of the buffer layer may have a dielectric constant of about 0.1 to about 12.

In some embodiments, the metal layer pattern and the buffer layer may have a sum of dielectric constants in a range of about −3.0 to about 3.0.

In some embodiments, the compound may further include phosphorus.

In some embodiments, the phosphorus may be included in an amount of less than or equal to about 10 atom % based on 100 atom % of the compound.

In some embodiments, the buffer layer may be an electron blocking layer that is in contact with the second electrode.

In some embodiments, the buffer layer may have an average thickness of about 1 nm to about 30 nm.

In some embodiments, the buffer layer may have an energy bandgap of about −3.8 eV to about −1.5 eV.

In some embodiments, the buffer layer may be a first buffer layer and the optoelectronic device may further include a second buffer layer between the first electrode and the photoelectric conversion layer. The second buffer layer may be a hole blocking layer.

In some embodiments, the second buffer layer may include an inorganic oxide selected from $MoO_{x1}$ ($2.58\leq x1<3.0$), $ZnO_{x2}$ ($1.0\leq x2<2.0$), $TiO_{x3}$ ($1.5\leq x3<2.0$), $VO_{x4}$ ($1.5\leq x4<2.0$), $TaO_{x5}$ ($1.0\leq x5<2.5$), $WO_{x6}$ ($2.0<x6<3.0$), and a combination thereof.

In some embodiments, each of the first electrode and the second electrode may include a metal, a metal oxide, or a combination thereof.

In some embodiments, the buffer layer may include a first electron blocking layer including silicon nitride ($SiN_x$, $0<x<1$) and a second electron blocking layer including silicon oxynitride ($SiO_yN_z$, $0<y<0.5$, $0<z\leq1$), P-doped silicon oxynitride ($SiO_yN_z$:P, $0<y<0.5$, $0<z\leq1$), or a combination thereof.

In some embodiments, optoelectronic device may be a light-emitting device, a photodetector, a memory device, or a solar cell.

According to example embodiments, an image sensor including the optoelectronic device is provided.

In some embodiments, image sensor may include a semiconductor substrate and the aforementioned optoelectronic device may be on the semiconductor substrate. The semiconductor substrate may be integrated with a plurality of first photo-sensing devices for sensing light in a blue wavelength region and a plurality of second photo-sensing devices for sensing light in a red wavelength region. The optoelectronic device may be an organic optoelectronic device for selectively absorbing light in a green wavelength region.

In some embodiments, the image sensor may further include a color filter layer including a blue filter for selectively absorbing light in a blue wavelength region and a red filter for selectively absorbing light in a red wavelength region.

In some embodiments, the first photo-sensing devices and the second photo-sensing devices may be stacked in a vertical direction in the semiconductor substrate.

In some embodiments, the image sensor may include a green photoelectric device for selectively absorbing light in a green wavelength region, a blue photoelectric device for selectively absorbing light in a blue wavelength region, and a red photoelectric device for selectively absorbing light in a red wavelength region. The green photoelectric device, the blue photoelectric device, and the red photoelectric device may be stacked. At least one of the green optoelectronic device, the blue optoelectronic device, and the red optoelectronic device may be the aforementioned optoelectronic device.

According to example embodiments, an electronic device including the image sensor is provided.

An optoelectronic device with improved efficiency may be provided by increasing the optical absorbance.

DETAILED DESCRIPTION

Figure 1:
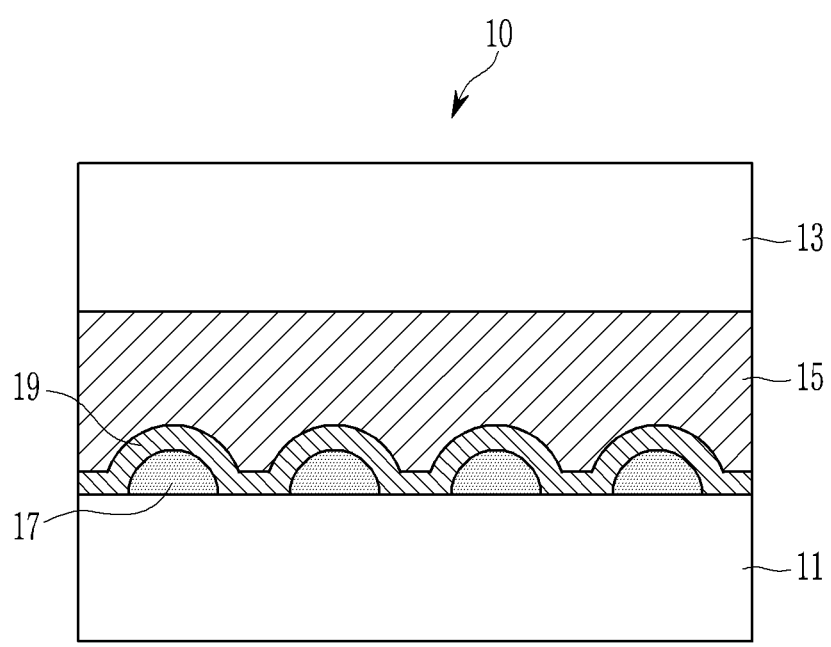
FIGS. 1 to 5 are cross-sectional views illustrating optoelectronic devices according to various example embodiments.

Some example embodiments will hereinafter be described in detail, and may be easily performed by those who have common knowledge in the related art. However, this disclosure may be embodied in many different forms and is not to be construed as limited to the example embodiments set forth herein. In the drawings, the thickness of layers, films, panels, regions, etc., are exaggerated for clarity. Like reference numerals designate like elements throughout the specification.

It will be understood that when an element or layer is referred to as being "on," "connected to," "coupled to," or "covering" another element or layer, it may be directly on, connected to, coupled to, or covering the other element or layer, or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of the example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

In the drawings, parts having no relationship with the description are omitted for clarity of the embodiments, and the same or similar constituent elements are indicated by the same reference numeral throughout the specification.

As used herein, when a definition is not otherwise provided, the term "substituted" may refer to replacement of hydrogen of a compound by a substituent selected from a halogen atom (F, Br, Cl or I), a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C20 alkyl group, a C1 to C20 alkoxy group, a C2 to C20 alkenyl group, a C2 to C20 alkynyl group, a C6 to C30 aryl group, a C7 to C30 arylalkyl group, a C1 to C20 heteroaryl group, a C3 to C20 heteroarylalkyl group, a C3 to C30 cycloalkyl group, a C3 to C15 cycloalkenyl group, a C6 to C15 cycloalkynyl group, a C2 to C20 heterocycloalkyl group, and a combination thereof.

As used herein, when a definition is not otherwise provided, the prefix "hetero" may refer to one including 1 to 3 heteroatoms selected from N, O, S, P, and Si.

As used herein, "an alkyl group" may be, for example a methyl group, an ethyl group, a propyl group, an isopropyl group, a n-butyl group, an isobutyl group, a t-butyl group, a pentyl group, a hexyl group, and the like.

As used herein, "a cycloalkyl group" may be a cyclopropyl group, a cyclobutyl group, a cyclopentyl group, a cyclohexyl group, and the like.

As used herein, "an aryl group" refers to a substituent including all element of the cycle having p-orbitals which form conjugation, and may be a monocyclic, polycyclic or fused ring polycyclic (i.e., rings sharing adjacent pairs of carbon atoms) functional group.

As used herein, when a definition is not otherwise provided, "a cyano-containing group" refers to a monovalent a functional group where at least one hydrogen of a C1 to C30 alkyl group, a C2 to C30 alkenyl group, or a C2 to C30 alkynyl group is replaced by a cyano group. In addition, the cyano-containing group may include a divalent functional group such as a dicyanoalkenyl group represented by $=(CR^x)_pC(CN)_2$ wherein RX is hydrogen or a C1 to C10 alkyl group and p is an integer ranging from 0 to 10. Examples of the cyano-containing group may be a dicyanomethyl group, a dicyanovinyl group, a cyano ethynyl group, and the like.

As used herein, when a definition is not otherwise provided, "a combination" refers to a mixture or a stack of two or more materials.

Hereinafter, an optoelectronic device according to example embodiments is described referring to drawings.

FIG. 1 is a cross-sectional view illustrating an optoelectronic device according to example embodiments.

Referring to FIG. 1, an optoelectronic device 10 according to example embodiments includes an anode 11 and a cathode 13 facing each other; a metal layer pattern 17 disposed on the anode 11 and a buffer layer 19 covering the metal layer pattern 17; and a photoelectric conversion layer 15 disposed on the buffer layer 19.

A substrate (not shown) may be disposed on a surface of the anode 11 and a surface of the cathode 13. The substrate may be, for example, made of an inorganic material such as glass, quartz, or a silicon wafer, or an organic material such as polycarbonate, polymethylmethacrylate, polyethyleneterephthalate, polybutyleneterephthalate, polyethylenenaphthalate, polyamide, polyethersulfone, polycarbonate, polyvinyl alcohol, polyacrylate, polyimide, polynorbornene, or a combination thereof. When the organic material is used, it may be applied to a flexible optoelectronic device.

At least one of the anode 11 and the cathode 13 may be a light-transmitting electrode. For example the anode 11 may be a non-light-transmitting electrode and the cathode 13 may be a light-transmitting electrode. Herein, the light-transmitting electrode may be a transparent electrode having a transmittance of greater than or equal to about 85% or greater than or equal to about 95%.

In example embodiments, the anode 11 may include a metal (and/or metal alloy), a metal oxide, or a combination thereof and the cathode 13 may include a metal, a metal oxide, or a combination thereof. When the anode 11 and/or the cathode 13 include a metal (and/or a metal alloy), a thickness of the metal (and/or the metal alloy) may be greater than or equal to about 1 nm and less than or equal to about 25 nm to form a transparent electrode.

The metal of the anode 11 may include at least one selected from silver (Ag), aluminum (Al), copper (Cu), gold (Au), and an alloy thereof and the metal oxide of the anode 11 may include at least one selected from an indium tin oxide (ITO), an indium zinc oxide (IZO), a zinc oxide (ZnO), a tin oxide (SnO), an aluminum tin oxide (AlTO) and a fluorine doped tin oxide (FTO).

The metal of the cathode 13 may include at least one selected from silver (Ag), aluminum (Al), copper (Cu), gold (Au), and an alloy thereof, and the metal oxide of the cathode 20 may include an indium tin oxide (ITO), an indium zinc oxide (IZO), a zinc oxide (ZnO), a tin oxide (SnO), an aluminum tin oxide (AlTO), a fluorine doped tin oxide (FTO), a molybdenum oxide, a tungsten oxide, a vanadium oxide, a rhenium oxide, a niobium oxide, a tantalum oxide, a titanium oxide, a zinc oxide, a nickel oxide, a copper oxide, a cobalt oxide, a manganese oxide, a chromium oxide, an indium oxide, or a combination thereof.

The metal layer pattern 17 includes a metal having a negative dielectric constant. The metal may have a dielectric constant of greater than or equal to about −12, greater than or equal to about −11, greater than or equal to about −10, or greater than or equal to about −8. In addition, the metal may have a dielectric constant of less than or equal to about −5, less than or equal to about −4, less than or equal to about −3, less than or equal to about −2, less than or equal to about −1, less than or equal to about −0.5, less than or equal to about −0.4, less than or equal to about −0.3, less than or equal to about −0.2, or less than or equal to about −0.1. For example the metal may have a dielectric constant of about −12 to about −0.1, about −11 to about −1, about −10 to about −0.5, about −8 to about −0.1, about −8 to about −0.5, or about −8 to about −1. The metal layer pattern 17 may include a metal selected from Ag, Au, Co, Cu, an alloy thereof, and a mixture thereof.

The metal layer pattern 17 may have a pattern size of about 5 nm to about 500 nm, specifically about 5 nm to about 300 nm, about 5 nm to about 250 nm, about 5 nm to about 200 nm, or about 5 nm to about 100 nm. Herein, the pattern size may refer to the largest length of a pattern in a repeating pattern. For example, in the case of a pattern of the hemisphere shape, the pattern size may refer to a diameter.

The metal layer pattern 17 may have a thickness of about 5 nm to about 300 nm, specifically about 5 nm to 200 nm, about 5 nm to about 150 nm, about 5 nm to about 100 nm, or about 5 nm to about 50 nm.

The metal layer pattern 17 having a pattern size and/or thickness in the above ranges is suitable for inducing a surface plasmon phenomenon that will be described later.

The metal layer pattern 17 may be formed by depositing a metal and then etching to form a pattern. Alternatively, a metal may be deposited and then patterned through a heat treatment process. The depositing may be performed by a chemical vapor deposition (CVD) method, for example a plasma enhanced chemical vapor deposition (PECVD) method. Conditions of the depositing (e.g., CVD or PECVD) are not particularly limited. The etching process may be a dry etching or wet etching process. The heat treatment process may be performed at about 150° C. to about 300° C., about 150° C. to about 250° C., for example about 180° C. to about 250° C.

The buffer layer 19 covers the upper surface of the metal layer pattern 17. The buffer layer 19 may include a compound selected from silicon nitride ($SiN_x$, 0<x<1), silicon oxynitride ($SiO_yN_z$, 0<y<0.5, 0<z≤1), P-doped silicon oxynitride ($SiO_yN_z$:P, 0<y<0.5, 0<z≤1), and a combination thereof.

In example embodiments, in the silicon oxynitride, y and z may be in the following ranges: 0.1≤y≤0.4 and 0<z≤1 or $0.1 \leq y \leq 0.3$ and $0.1 \leq z \leq 0.7$. In example embodiments, the buffer layer 19 may include a compound selected from silicon nitride ($SiN_x$, $0.2 \leq x \leq 0.7$), silicon oxynitride ($SiO_yN_z$, $0.05 \leq y \leq 0.35$, $0.2 \leq z \leq 0.7$), P-doped silicon oxynitride ($SiO_yN_z$:P, $0.05 \leq y \leq 0.35$, $0.2 \leq z \leq 0.7$), and a combination thereof.

Herein, the x, y, and z of the compound may provide a dielectric constant that may be offset from the dielectric constant of the metal included in the metal layer pattern 17. It may be possible to provide buffer layer materials having an electron blocking performance while improving and/or maximizing a surface plasmon phenomenon with the metal layer pattern 17 at a stoichiometric ratio (x, y, and z) of the ranges, and improving a dark current.

As used herein, the stoichiometric ratios x, y, and z may be confirmed by composition ratio analyses using methods of XPS (X-ray photoelectron spectroscopy), AES (Auger electron spectroscopy), RBS (Rutherford backscattering spectrometry), and the like, but is not limited thereto.

The compound of the buffer layer 19 may have a dielectric constant of less than or equal to about 12, less than or equal to about 11, less than or equal to about 10, or less than or equal to about 8. In addition, the compound may have a dielectric constant of greater than or equal to about 5, greater than or equal to about 4, greater than or equal to about 3, greater than or equal to about 2, greater than or equal to about 1, greater than or equal to about 0.5, greater than or equal to about 0.4, greater than or equal to about 0.3, greater than or equal to about 0.2, or greater than or equal to about 0.1. For example, the compound may have a dielectric constant of about 0.1 to about 12, about 1 to about 11, about 0.5 to about 10 about 0.1 to about 8, about 0.5 to about 8 or about 1 to about 8.

The metal layer pattern 17 and the buffer layer 19 may have a sum of dielectric constants in the range of about −3.0 to about 3.0, for example about −2.5 to about +2.5, about −2.5 to about +1.0, or about −2.0 to about +2.0. That is, the metal layer pattern 17 and buffer layer 19 may have an absolute value of the sum of dielectric constants may be less than or equal to about 3.0, less than or equal to about 2.5, less than or equal to about 2.2, less than or equal to about 2.0, less than or equal to about 1.5, less than or equal to about 1.0, less than or equal to about 0.5, or less than or equal to about 0.2. When the absolute value of the sum of dielectric constants is less than about 3.0, the surface plasmon phenomenon (SPR) may be increased and thus the optical absorbance and efficiency of the photoelectric conversion layer 15 may be increased.

The compound may further include phosphorus. If the compound further includes phosphorus, the number of dangling bonds, particularly Si dangling bonds, may be reduced and thus structure defects may be reduced.

The phosphorus may be included in an amount of less than or equal to about 10 atom %, for example about 0.01 atom % to about 10 atom % or 0.1 atom % to about 8 atom %, relative to 100 atom % of the compound. Herein, 100 atom % of the compound may refer to a sum of all elements forming the compound is 100 atom %. Within the ranges, the number of dangling bonds, particularly Si dangling bonds, may be reduced, structure defects may be reduced, and a bandgap may be increased.

When the anode 11 includes a metal oxide, for example indium tin oxide (ITO), indium zinc oxide (IZO), zinc oxide (ZnO), tin oxide (SnO), aluminum tin oxide (AITO), fluorine doped tin oxide (FTO), and the like, the silicon nitride may have a valence band level of about −5.0 eV to about −4.5 eV and a conduction band level of about −3.5 eV to about −2.0 eV. When the anode 11 includes a metal oxide, for example indium tin oxide (ITO), indium zinc oxide (IZO), zinc oxide (ZnO), tin oxide (SnO), aluminum tin oxide (AITO), fluorine doped tin oxide (FTO), and the like, the silicon oxynitride may have a valence band level of about −5.8 eV to about −4.5 eV and a conduction band level of about −3.5 eV to about −1.5 eV. The buffer layer 19 may have an energy bandgap of about −3.8 eV to about −1.5 eV, for example about −3.7 eV to about −1.9 eV. Within the ranges, the dark current of the optoelectronic device 10 may be reduced and/or minimized while effectively limiting and/or blocking electrons moving to the anode 11.

The silicon nitride or the silicon oxynitride may have the aforementioned valance and conduction band levels by adjusting x indicating a stoichiometric ratio of the silicon nitride or y and z indicating a stoichiometric ratio of the silicon oxynitride within the range. The silicon nitride, silicon oxynitride, and P-doped silicon oxynitride having a stoichiometric ratio within the ranges have a higher valence band level and a lower conduction band level than general silicon nitride ($Si_3N_4$) or general silicon oxynitride ($Si_2ON_2$ or $SiON_3$).

A valence band (VB) level of the buffer layer 19 may be higher that a HOMO level of the photoelectric conversion layer 15 and a conduction band (CB) level of the buffer layer 19 may be higher than a LUMO level of the photoelectric conversion layer 15. For example, a difference between the valence band (VB) level of the buffer layer 19 and the HOMO level of the photoelectric conversion layer 15 may be greater than about 0 eV and less than or equal to about 0.5 eV and a difference between the conduction band (CB) of the buffer layer 19 and a LUMO level of the photoelectric conversion layer 15 may be greater than or equal to about 1.1 eV and less than or equal to about 4 eV. Accordingly, the electron blocking layer (EBL) may not limit and/or block transfer of holes from the photoelectric conversion layer 15 but effectively limit and/or block transfer of electrons to the anode 11. The photoelectric conversion layer 15 may be disposed on the buffer layer 19.

When the optoelectronic device 10 is a light-receiving device, the photoelectric conversion layer 15 includes a p-type semiconductor and n-type semiconductor to form a pn junction, and externally receives light, produces excitons, and separates the excitons into holes and electrons. The p-type semiconductor and the n-type semiconductor may be an organic material, an inorganic material, or a combination thereof.

The photoelectric conversion layer 15 may include an intrinsic layer including both a p-type semiconductor and an n-type semiconductor, and may be formed, for example, using a codeposition method and the like.

The photoelectric conversion layer 15 may further include at least one selected from a p-type layer and an n-type layer along with the intrinsic layer. The p-type layer includes a p-type semiconductor and the n-type layer includes an n-type semiconductor.

The p-type semiconductor may include, for example, a compound such as an indanone derivative, an indandinone derivative, N,N-dimethyl-quinacridone (DMQA), diindenoperylene, dibenzo{[f,f']-4,4',7,7'-tetraphenyl}diindeno[1,2,3-cd:1',2',3'-lm]perylene, but is not limited thereto.

The indanone derivative and the indandinone derivative may be represented by Chemical Formula 1.

[Chemical Formula 1]

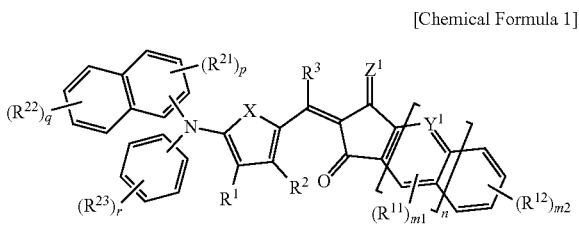

In Chemical Formula 1,

X is selected from S, Se, Te, S(═O), S(═O)$_2$, and SiR$^a$R$^b$ (wherein R$^a$ and R$^b$ are selected from hydrogen and a substituted or unsubstituted C1 to C10 alkyl group), Z$^1$ is selected from O and CR$^c$R$^d$ (wherein R$^c$ and R$^d$ are independently hydrogen, a substituted or unsubstituted C1 to C10 alkyl group, a cyano group, or a cyano-containing group, and at least one of R$^c$ and R$^d$ is a cyano group or a cyano-containing group), Y$^1$ is selected from N and CR$^e$ (wherein R$^e$ is hydrogen or a substituted or unsubstituted C1 to C10 alkyl group), R$^1$ to R$^3$, R$^{11}$, and R$^{12}$ are independently selected from hydrogen, a substituted or unsubstituted C1 to C30 alkyl group, a substituted or unsubstituted C6 to C30 aryl group, a substituted or unsubstituted C4 to C30 heteroaryl group, a halogen, a cyano group (—CN), a cyano-containing group, and a combination thereof, m1 is 0 or 1, m2 is an integer ranging from 0 to 4, n is 0 or 1, R$^{21}$ to R$^{23}$ are independently selected from hydrogen, a halogen, a cyano group (—CN), a cyano-containing group, a substituted or unsubstituted C1 to C6 alkyl group, a substituted or unsubstituted C1 to C6 alkoxy group, and a combination thereof, p is an integer ranging from 0 to 3, q is an integer ranging from 0 to 4, and r is an integer ranging from 0 to 5.

The n-type semiconductor may include, for example, dicyanovinyl-terthiophene (DCV3T), subphthalocyane (SubPc), fullerene, a fullerene derivative, perylene diimide, and the like, but is not limited thereto.

The fullerene may include C50, C60, C70, C76, C78, C80, C82, C84, C90, C96, C240, C540, a mixture thereof, a fullerene nanotube, and the like. The fullerene derivative may refer to compounds of these fullerenes having a substituent attached thereto. The fullerene derivative may include a substituent such as an alkyl group, an aryl group, or a heterocyclic group. Examples of the aryl groups and heterocyclic groups may be are a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a benzimidazole ring, an imidazopyridine ring, a quinolizidine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, an xanthene ring, a phenoxathin ring, a phenothiazine ring, or a phenazine ring.

On the other hand, when the optoelectronic device 10 is a light-emitting device, the photoelectric conversion layer 15 may include materials that recombine holes injected from the anode 11 and electrons injected from the cathode 13 to form excitons, receive energy from the excitons, and thus emit light of a particular wavelength. These materials may be an organic compound, an inorganic compound without a particular limit. For example, a material emitting green-based light may be poly(p-phenylenevinylene) (p-PPV) and the like, a material emitting red light may be MEH-PPV (poly[2-methoxy-5-(2'-ethyl-hexyloxy)-1,4-phenylene vinylene] emitting orange light and the like.

The buffer layer 19 may include a first electron blocking layer disposed on the metal layer pattern 17 and including silicon nitride (SiN$_x$, 0<x<1) and a second electron blocking layer including a silicon oxynitride (SiO$_y$N$_z$, 0<y<0.5, 0<z≤1), P-doped silicon oxynitride (SiO$_y$N$_z$, 0<y<0.5, 0<z≤1), or a combination thereof. The first electron blocking layer and the second electron blocking layer may alternately be disposed to provide a multi-layered buffer layer.

In example embodiments, in the silicon oxynitride, y and z may be in the following ranges: 0.1≤y≤0.4 and 0<z≤1 or 0.1≤y≤0.3 and 0.1≤z≤0.7. In example embodiments, the buffer layer 19 may include a compound selected from silicon nitride (SiN$_x$, 0.2≤x≤0.7), silicon oxynitride (SiO$_y$N$_z$, 0.05≤y≤0.35, 0.2≤z≤0.7), P-doped silicon oxynitride (SiO$_y$N$_z$:P, 0.05≤y≤0.35, 0.2≤z≤0.7), and a combination thereof. Herein, the x, y, and z of the compound may provide a dielectric constant that may be offset from the dielectric constant of the metal included in the metal layer pattern 17. It may be possible to provide buffer layer materials having an electron blocking performance while improving and/or maximizing a surface plasmon phenomenon with the metal layer pattern 17 at a stoichiometric ratio (x, y, and z) of the ranges, and improving a dark current.

The buffer layer 19 may have a thickness of about 1 nm to about 30 nm, for example about 2 nm to about 20 nm, or about 3 nm to about 15 nm. When the thickness is within the ranges, it is possible to increase a surface plasmon phenomenon with the metal layer pattern 17 without deteriorating the photoelectric conversion efficiency and to increase the optical absorbance of the optoelectronic device.

The buffer layer 19 may have a surface roughness of about 0.2 nm to about 20 nm, for example about 0.5 nm to about 15 nm, or about 1 nm to about 10 nm. Adhesion characteristics between the buffer layer 19 and the photoelectric conversion layer 15 and light transmittance characteristics thereof may be desirable within the ranges.

The buffer layer 19 may include silicon nitride having a stoichiometric ratio within the ranges by depositing a silicon source material and a nitrogen source material under an atmosphere selected from an inert atmosphere, a reduction atmosphere, or a combination thereof, while controlling their supply amounts. The silicon source material may be a silane compound, and its specific examples may include silane (SiH$_4$), disilane, and a derivative thereof. The nitrogen source material may be N$_2$, NH$_3$, and the like. The inert atmosphere may be an inert gas atmosphere including nitrogen, argon, and the like, and the reduction atmosphere is a hydrogen atmosphere or a mixture atmosphere of the hydrogen and the inert gas. The depositing may be performed in a chemical vapor deposition (CVD) method (CVD), for example, a plasma enhanced chemical vapor deposition (CVD) method (PECVD). The depositing (e.g., CVD or PECVD) is not performed under a particularly limited condition.

In addition, the buffer layer 19 may include silicon oxynitride having a stoichiometric ratio within the ranges by depositing a silicon source material and an oxygen-containing nitrogen source material under an inert atmosphere, a reduction atmosphere, or a combination thereof, while their supply amounts are controlled; by depositing a silicon source material, a nitrogen source material, and an oxygen-containing nitrogen source material under an inert atmosphere, a reduction atmosphere, or a combination thereof, while their supply amounts are controlled; or by depositing a silicon source material and a nitrogen source material under an oxygen atmosphere or an oxygen-containing atmosphere, while controlling their supply amounts. The silicon source material may be a silane compound, and its specific examples may be silane ($SiH_4$), disilane, a derivative thereof, and a combination thereof. In addition, the oxygen-containing nitrogen source material may be nitrous oxide ($N_2O$), nitrogen monoxide (NO), dinitrogen pentoxide ($N_2O_5$), dinitrogen tetraoxide ($N_2O_4$), or a combination thereof. The nitrogen source material may be $N_2$, $NH_3$, and the like. The inert atmosphere may be include an inert gas atmosphere including nitrogen, argon, and the like, and the reduction atmosphere may be a hydrogen atmosphere or a mixture atmosphere of the hydrogen and the inert gas. The inert atmosphere may be an inert gas atmosphere including nitrogen, argon, and the like, and the reduction atmosphere may be a hydrogen atmosphere or a mixture atmosphere of the hydrogen and the inert gas. The depositing may be performed in a chemical vapor deposition method (CVD), for example, in a plasma enhanced chemical vapor deposition method (PECVD). The depositing (e.g., CVD or PECVD) is not performed under a particularly limited condition.

When phosphorus is further doped in the silicon nitride or the silicon oxynitride, a phosphorus-containing material may be supplied together with the source materials. Such a phosphorus-containing material may be phosphine (PH3), alkyl phosphine, aryl phosphine, phosphine oxide, an organic phosphate salt, and the like. The alkyl phosphine may be trimethylphosphine, triethylphosphine, and the like, the aryl phosphine may be triphenylphosphine, and the like, the phosphine oxide may be trimethylphosphine oxide, triethylphosphine oxide, and the like, and the organic phosphate salt may be trimethylphosphate, triethylphosphate, and the like.

FIG. 1, the metal layer pattern 17 is illustrated as a hemisphere shape, but it may have a shape selected from a cylinder, a block, and a hemisphere, and is not particularly limited.

Figure 2:
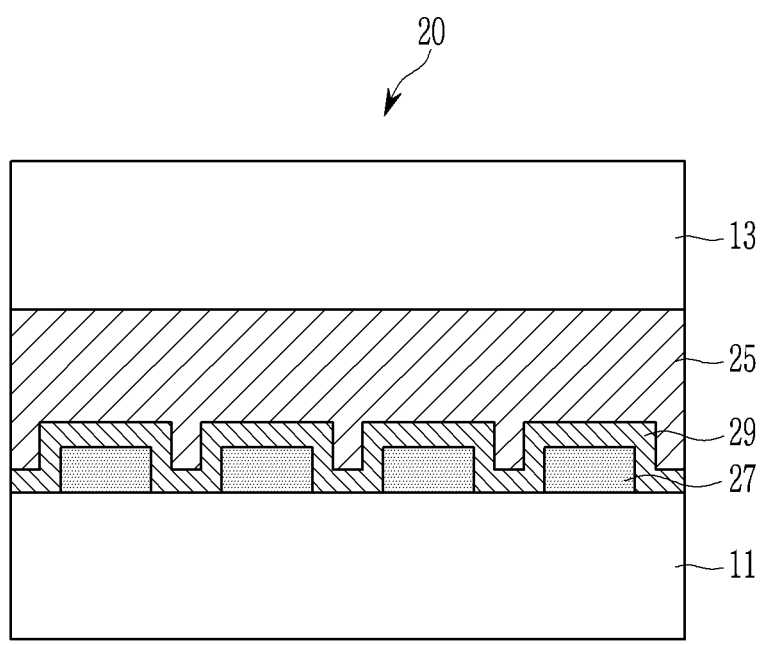
Figure 3:
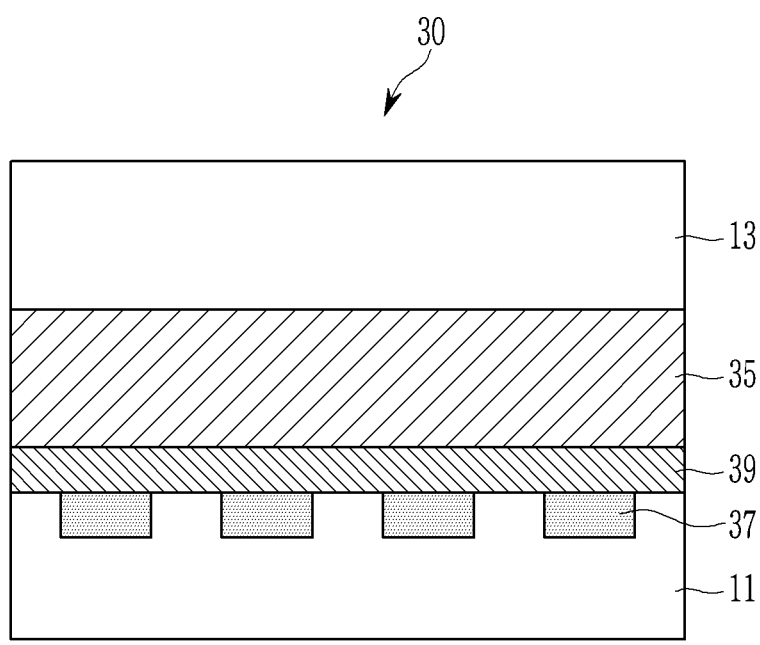

The case where the metal layer pattern has a block shape is illustrated in FIG. 2 and the case where the pattern embedded into the anode is illustrated in FIG. 3.

FIGS. 2 and 3 are cross-sectional views illustrating optoelectronic devices according to example embodiments.

Referring to FIG. 2, an optoelectronic device 20 includes an anode 11 and a cathode 13 facing each other; a metal layer pattern 27 disposed on the anode 11 and a buffer layer 29 covering the metal layer pattern 27; and a photoelectric conversion layer 25 disposed on the buffer layer 29, wherein the metal layer pattern 27 is formed in a block shape and the buffer layer 29 is formed along with the shape of the metal layer pattern 27.

Referring to FIG. 3, the optoelectronic device 20 includes an anode 11 and a cathode 13 facing each other; a metal layer pattern 37 having a pattern embedded from the upper surface of the anode 11, and a buffer layer 39 covering the metal layer pattern 37; and a photoelectric conversion layer 35 disposed on the buffer layer 39.

The buffer layer 39 may be a first buffer layer, and a second buffer layer may be further included between the cathode 13 and the photoelectric conversion layer 35. The second buffer layer may be a hole blocking layer. The optoelectronic device having the above structure is illustrated in FIG. 4.

Figure 4:
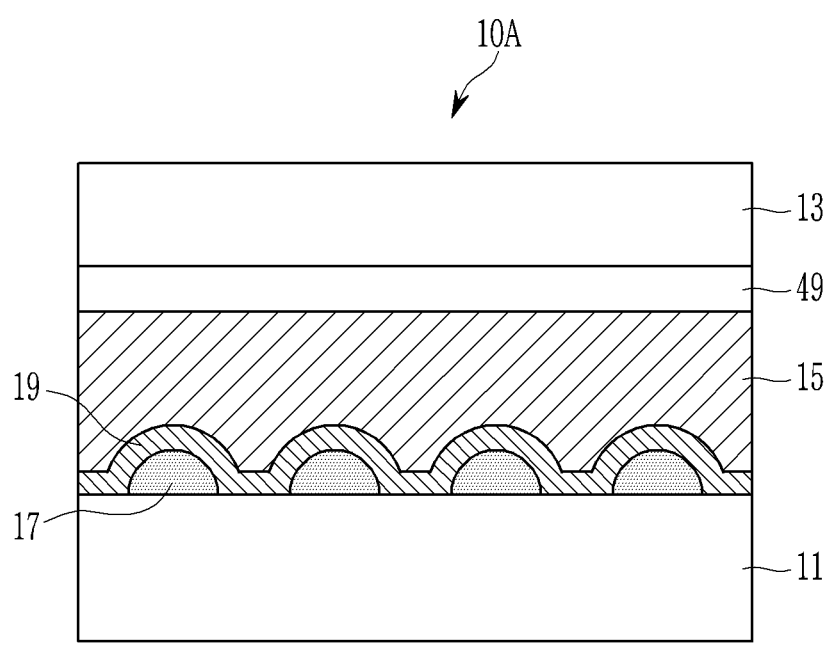

FIG. 4 is a cross-sectional view illustrating an optoelectronic device according to example embodiments.

Referring to FIG. 4, an optoelectronic device 10A includes an anode 11 and a cathode 13 facing each other; a metal layer pattern 17 disposed on the anode 11 and a buffer layer 19 covering the metal layer pattern 17; a photoelectric conversion layer 15 disposed on the buffer layer 19; and a second buffer layer 49 disposed between the cathode 13 and the photoelectric conversion layer 15.

The second buffer layer 49 may include an inorganic oxide selected from $MoO_{x1}$ (2.58≤x1<3.0), $ZnO_{x2}$ (1.0≤x2<2.0), $TiO_{x3}$ (1.5≤x3<2.0), $VO_{x4}$ (1.5≤x4<2.0), $TaO_{x5}$ (1.0≤x5<2.5), $WO_{x6}$ (2.0<x6<3.0), and a combination thereof.

Figure 5:
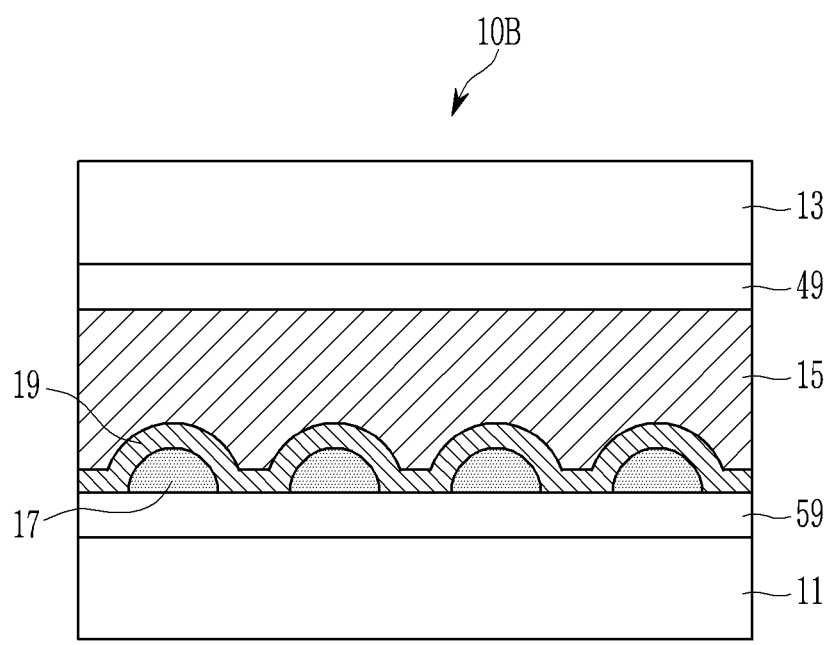

The optoelectronic device may further include a third buffer layer on the anode 11, wherein the third buffer layer is selected from an a hole injection layer (HIL) facilitating injection of holes, a hole transport layer (HTL) facilitating transportation of the holes, and a combination thereof The optoelectronic device having the above structure is illustrated in FIG. 5.

FIG. 5 is a cross-sectional view illustrating an optoelectronic device according to example embodiments.

Referring to FIG. 5, an optoelectronic device 10B includes an anode 11 and a cathode 13 facing each other; a metal layer pattern 17 disposed on the anode 11 and a buffer layer 19 covering the metal layer pattern 17; a photoelectric conversion layer 15 disposed on the buffer layer 19; a second buffer layer 49 disposed between the cathode 13 and the photoelectric conversion layer 15; and a third buffer layer 59 disposed between the anode 11 and the metal layer pattern 17.

Although not shown in the drawing, the optoelectronic device may further include a fourth buffer layer between the cathode 13 and the photoelectric conversion layer 15 or between the cathode 13 and the second buffer layer 49 wherein the fourth buffer layer is selected from an electron injection layer (EIL) facilitating injection of electrons, an electron transporting layer (ETL) facilitating transportation of the electrons, and a combination thereof.

The hole transport layer (HTL) may include one selected from, for example, poly(3,4-ethylenedioxythiophene):poly(styrene sulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), tungsten oxide (WOx, 0<x≤3), molybdenum oxide (MOx, 1<x<3), vanadium oxide ($V_2O_5$), rhenium oxide, nickel oxide (NiOx, 1<x<4), copper oxide, titanium oxide, molybdenum sulfide, and a combination thereof, but is not limited thereto.

The electron transport layer (ETL) may include, for example one selected from 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, aluminum (Al), an aluminum oxide, magnesium (Mg), a magnesium oxide, molybdenum (Mo), a molybdenum oxide and a combination thereof, but is not limited thereto.

The optoelectronic devices 10, 20, 30, 10A, and 10B may be a light-receiving device or a light emitting device, and examples thereof may be a photodiode, a light emitting diode, a solar cell, and may be also applied to an image sensor, a photosensor, a photodetector, without limitation.

The optoelectronic device may be an organic optoelectronic device, for example an organic photodiode, an organic light emitting diode (OLED), an organic solar cell, and may be applied to an organic image sensor, an organic photosensor, an organic photodetector, an organic solar cell, and the like.

Hereinafter, an example of an image sensor including the optoelectronic device is described referring to drawings. As an example of an image sensor, an organic CMOS image sensor is described.

Figure 6:
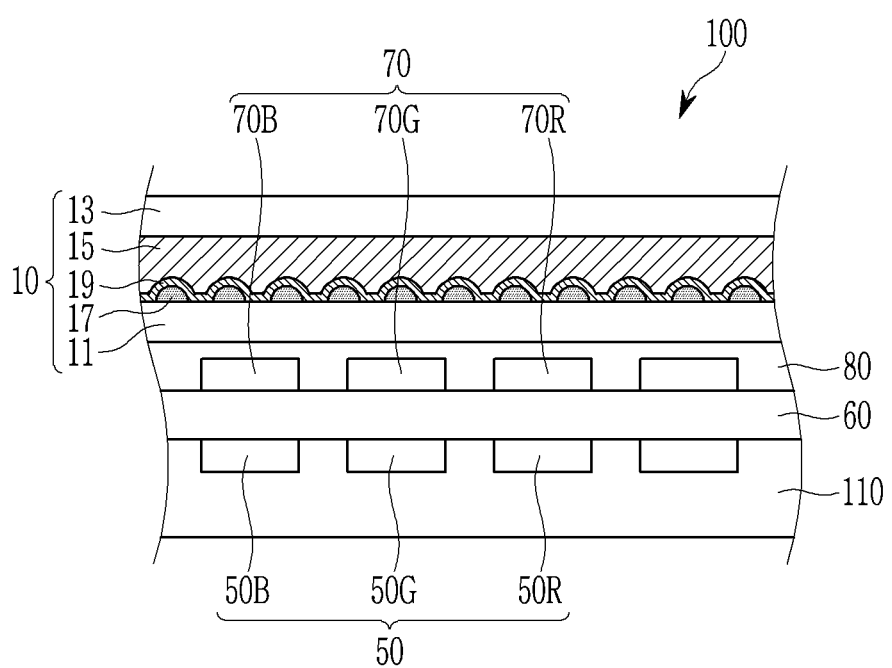
FIG. 6 is a cross-sectional view illustrating a CMOS image sensor according to example embodiments.

FIG. 6 is a cross-sectional view showing an organic CMOS image sensor according to example embodiments.

FIG. 6 shows a blue pixel, a green pixel, and a red pixel that are adjacent to each other, but this is not limiting. Hereinafter, a constituent element including "B" in the reference numeral refers to a constituent element included in the blue pixel, a constituent element including "G" in the reference numeral refers to a constituent element included in the green pixel, and a constituent element including "R" in the reference numeral refers to a constituent element included in the red pixel.

Referring to FIG. 6, a CMOS image sensor 300 according to example embodiments includes a semiconductor substrate 110 integrated with a photo-sensing device 50, and a transmission transistor (not shown), a lower insulation layer 60, color filters 70B, 70G, and 70R, an upper insulation layer 80, and an optoelectronic device 10.

The semiconductor substrate 110 may be a silicon substrate, and is integrated with the photo-sensing device 50 and transmission transistor (not shown). The photo-sensing device 50 may be a photodiode. The photo-sensing device 50 and the transmission transistor 55 may be integrated in each pixel, and as shown in the drawing, the photo-sensing device 50 may include a photo-sensing device 50B of a blue pixel, a photo-sensing device 50G of a green pixel, and a photo-sensing device 50R of a red pixel. The photo-sensing device 50 senses light, and the information sensed by the photo-sensing device 50 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF.

The lower insulation layer 60 has a trench (not shown) exposing the photo-sensing devices 50B, 50G, and 50R. The trench may be filled with fillers.

A color filter layer 70 is formed on the lower insulation layer 60. The color filter layer 70 includes a blue filter 70B formed in the blue pixel, a green filter 70G formed in the green pixel, and a red filter 70R filled in the red pixel. The upper insulation layer 80 is formed on the color filter layer 70. The upper insulation layer 80 may eliminate a step caused by the color filter layer 70 and may smoothen the surface. The optoelectronic device 10 is formed on upper insulation layer 80.

As described above, the optoelectronic device 10 includes the anode 11 and the cathode 13 facing each other; the metal layer pattern 17 disposed on the anode 11 and the buffer layer 19 covering the metal layer pattern 17; and the photoelectric conversion layer 15 disposed on the buffer layer 19.

The drawing shows an example embodiment in which the anode 11 is disposed on the upper insulation layer 80, but the cathode 13 may be disposed on the upper insulation layer 80.

At least one of the anode 11 and the cathode 13 may be, for example, a light transmitting electrode, and the photoelectric conversion layer 15 may include an organic material absorbing light in a visible region.

The light incident from the anode 11 or the cathode 13 may be photoelectrically converted in the photoelectric conversion layer 15, may be passed through the cathode 13 or the anode 11, and may be sensed by a photo-sensing device 50.

A CMOS image sensor 300 according to the embodiment includes the aforementioned optoelectronic device 10 and thereby the surface plasmon phenomenon of the metal layer pattern 17 and the buffer layer 19 may improve the optical absorbance, and the image sensor noise may be reduced and the performance may be improved by decreasing the dark current while ensuring the photoelectric conversion efficiency (EQE).

Figure 7:
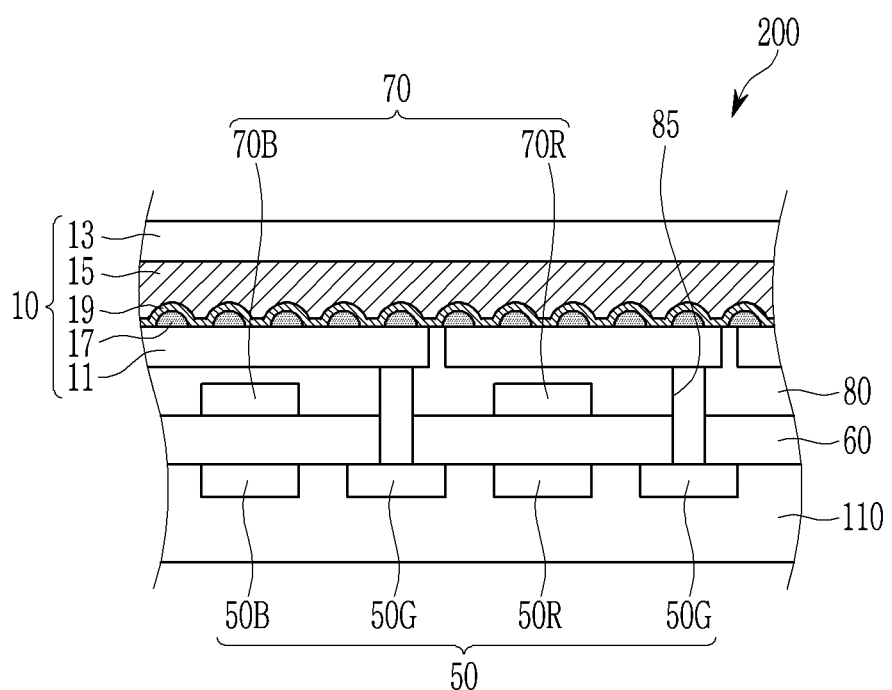
FIG. 7 is a cross-sectional view illustrating an organic CMOS image sensor according to example embodiments.

FIG. 7 is a cross-sectional view showing an organic CMOS image sensor according to example embodiments.

The organic CMOS image sensor 400 according to the present embodiment includes a semiconductor substrate 110 integrated with a photo-sensing device 50, and a transmission transistor (not shown), a lower insulation layer 60, a color filter layer 70, an upper insulation layer 80, and an optoelectronic device 10, as above described.

However, the organic CMOS image sensor 400 according to the present embodiment may omit the green filter 70G, different from the embodiment in FIG. 6, and instead may substitute the photoelectric conversion layer 15 of the optoelectronic device 10 for the green filter 70G. The photoelectric conversion layer 15 of the optoelectronic device 10 may include, for example, an organic material mainly adsorbing light in a green wavelength region, and the light incident from the cathode 13 may be photoelectrically converted by mainly adsorbing light in the green wavelength region at the photoelectric conversion layer 15, while light in the other wavelength regions is passed through the anode 11 and sensed by a photo-sensing device 50. The upper insulation layer 80 and lower insulation layer 60 have through-holes 85 to expose a photo-sensing device 50G of a green pixel.

However, when the photoelectric conversion layer 15 of the optoelectronic device 10 includes an organic material that mainly absorbs light of a red wavelength region and an organic material that mainly absorbs light of a blue wavelength region, a red filter 70R or a blue filter 70B may be substituted with the photoelectric conversion layer 15.

The image sensor includes a semiconductor substrate integrated with a plurality of first photo-sensing devices sensing light in a blue wavelength region, a plurality of second photo-sensing devices sensing light in a red wavelength region, and a third photo-sensing device positioned on the semiconductor substrate and selectively absorbing light in a green wavelength region, wherein at least one of the first photo-sensing device, the second photo-sensing device, and the third photo-sensing device may include the optoelectronic device.

The image sensor may further include a color filter layer including a blue filter selectively absorbing light in a blue wavelength region and a red filter selectively absorbing light in a red wavelength region, between the semiconductor substrate and the third photo-sensing device.

The first photo-sensing device and the second photo-sensing device may be stacked in a vertical direction in the semiconductor substrate. Such a structure is illustrated in FIG. 5. The CMOS image sensor 500 of FIG. 5 may include a semiconductor substrate 110 integrated with a first photo-sensing device 50B and a second photo-sensing device 50R, a charge storage device 55, and a transmission transistor (not shown), an upper insulation layer 80, and an optoelectronic device 10.

Figure 8:
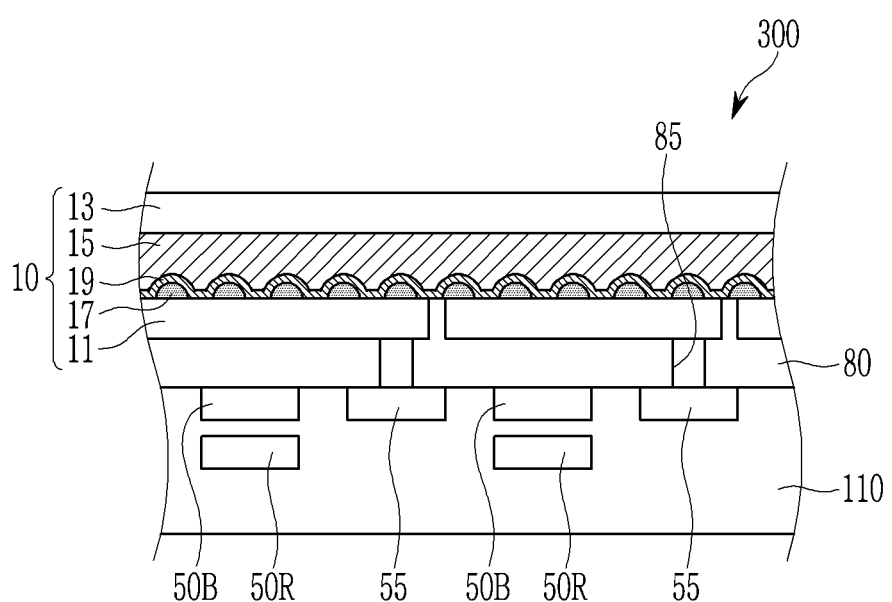
FIG. 8 is a cross-sectional view illustrating an organic CMOS image sensor according to example embodiments.

FIGS. 6 to 8 illustrate embodiments including the optoelectronic device of FIG. 1, but the optoelectronic device 10 of FIG. 1 may be substituted with one of the optoelectronic devices 20, 30, 40, 10A, and 10B shown in FIGS. 2 to 5.

Figure 9:
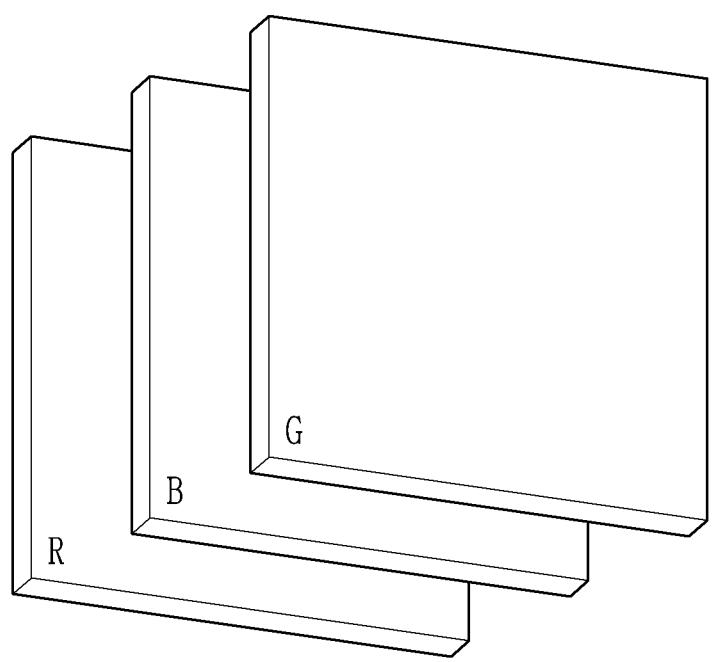
FIG. 9 is a schematic cross-sectional view illustrating an organic CMOS image sensor according to example embodiments.

FIG. 9 is a cross-sectional view showing a CMOS image sensor according to example embodiments. The CMOS image sensor comprises a green optoelectronic device (G) for selectively absorbing light in a green wavelength region, a blue optoelectronic device (B) for selectively absorbing light in a blue wavelength region, and a red optoelectronic device (R) which are stacked.

According to example embodiments, an electronic device including the image sensor is provided.

The electronic device may be, for example, a mobile phone, a digital camera, a biosensor, and the like, but is not limited thereto.

Hereinafter, the present disclosure is illustrated in more detail with reference to examples. However, these examples are non-limiting, and the present disclosure is not limited thereto.

Manufacture of Optoelectronic Device

Comparative Example 1

A 150 nm-thick anode is formed on a glass substrate by sputtering indium tin oxide (ITO). On the anode, 210 nm-thick photoelectric conversion layer is formed by codepositing a compound represented by Chemical Formula 1-1 (2-((5-(naphthalen-1-yl(phenyl)amino)selenophen-2-yl)methylene)-1H-indene-1,3(2H)-dione) and C60 in a volume ratio of 1:1. On the photoelectric conversion layer, a 7 nm-thick cathode is formed by thermally depositing ITO to manufacture an optoelectronic device.

[Chemical Formula 1-1]

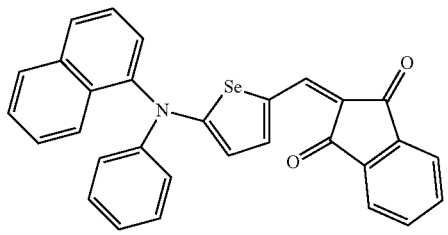

Examples 1 to 3 and Comparative Examples 2 to 4

A 150 nm-thick anode is formed on a glass substrate by sputtering indium tin oxide (ITO). Ag is deposited on the anode and patterned to form a 7 nm-thick metal layer pattern with a hemispherical shape having a diameter 200 nm. Then, a 5 nm-thick silicon nitride ($SiN_x$) buffer layer is formed in a chemical vapor deposition (CVD) method, while supplying silane ($SiH_4$) and $N_2$ are under an argon atmosphere. On the silicon nitride ($SiN_x$) buffer layer, a 210 nm-thick photoelectric conversion layer is formed codepositing a compound represented by Chemical Formula 1-1 (2-((5-(naphthalen-1-yl(phenyl)amino)selenophen-2-yl)methylene)-1H-indene-1,3(2H)-dione) and C60 in a volume ratio of 1:1. On the photoelectric conversion layer, a 7 nm-thick cathode is formed by thermally depositing ITO to manufacture an optoelectronic device. The x values of the silicon nitride ($SiN_x$) in Examples 1 to 3 and Comparative Examples 2 to 4 are shown in Table 1.

Examples 4 to 12

A 150 nm-thick anode is formed by sputtering indium tin oxide (ITO) on a glass substrate. Ag is deposited on the anode and patterned to form a 7 nm-thick metal layer pattern with a hemispherical shape having a diameter 200 nm. Then, a 5 nm-thick silicon oxynitride buffer layer is formed on the anode in a chemical vapor deposition (CVD) method, while supplying silane ($SiH_4$), nitrous oxide ($N_2O$), and $NH_3$ under an argon atmosphere. On the buffer layer, a 210 nm-thick photoelectric conversion layer is formed codepositing a compound represented by Chemical Formula 1-1 (2-((5-(naphthalen-1-yl(phenyl)amino)selenophen-2-yl)methylene)-1H-indene-1,3(2H)-dione) and C60 in a volume ratio of 1:1. On the photoelectric conversion layer, a 7 nm-thick cathode is formed by thermally depositing ITO to manufacture an optoelectronic device.

Example 13

A 150 nm-thick anode is formed by sputtering indium tin oxide (ITO) on a glass substrate. Ag is deposited on the anode and patterned to form a metal layer pattern with a hemispherical shape having a diameter 200 nm. Then, a 5 nm-thick P-doped silicon oxynitride buffer layer is formed on the anode in a chemical vapor deposition (CVD) method, while supplying silane ($SiH_4$), nitrous oxide ($N_2O$), $NH_3$, and $PH_3$ under an argon atmosphere. On the P-doped silicon oxynitride buffer layer, a 210 nm-thick photoelectric conversion layer is formed codepositing a compound represented by Chemical Formula 1-1 (2-((5-(naphthalen-1-yl (phenyl)amino)selenophen-2-yl)methylene)-1H-indene-1,3 (2H)-dione) and C60 in a volume ratio of 1:1. On the photoelectric conversion layer, a 7 nm-thick cathode is formed by thermally depositing ITO to manufacture an optoelectronic device.

Stoichiometric Ratio of Buffer Layer

Stoichiometric ratios of the silicon nitride ($SiN_x$) according to Examples 1 to 3 and Comparative Examples 2 to 4 are measured through XPS (X-ray photoelectron spectroscopy) and shown in Table 1.

TABLE 1

| Nos. | x value of $SiN_x$ |
|---|---|
| Example 1 | 0.45 |
| Example 2 | 0.67 |
| Example 3 | 0.92 |
| Comparative Example 2 | 0.00 |
| Comparative Example 3 | 1.21 |
| Comparative Example 4 | 1.44 |

In Table 1, when the x value is zero, this means that the buffer layer of Comparative Example 2 is a Si buffer layer.

Stoichiometric ratios of the silicon oxynitride ($SiO_yN_z$) according to Examples 4 to 12 and a stoichiometric ratio of the P-doped silicon nitride ($SiO_yN_z$:P) according to Example 13 are measured through XPS (X-ray photoelectron spectroscopy) and shown in Table 2.

TABLE 2

|  | y value of $SiO_yN_z$ | z value of $SiO_yN_z$ |
| --- | --- | --- |
| Example 4 | 0.15 | 0.45 |
| Example 5 | 0.25 | 0.45 |
| Example 6 | 0.40 | 0.45 |
| Example 7 | 0.15 | 0.67 |
| Example 8 | 0.25 | 0.67 |
| Example 9 | 0.40 | 0.67 |
| Example 10 | 0.15 | 1.00 |
| Example 11 | 0.25 | 1.00 |
| Example 12 | 0.40 | 1.00 |
| Example 13 | 0.33 | 0.45 |

Dielectric Constant of Buffer Layer

The dielectric constants of the buffer layers according to Example 4 to 12 are measured by an optical dielectric measurement method (elipsometer, Wollam, RC2), and is shown in Table 3.

TABLE 3

|  | Dielectric constant of buffer layer | Sum of dielectric constants of metal layer pattern and buffer layer |
| --- | --- | --- |
| Example 4 | 9.8 | 0.6 |
| Example 5 | 9.5 | 0.3 |
| Example 6 | 8.8 | −0.4 |
| Example 7 | 9 | −0.2 |
| Example 8 | 8.65 | −0.55 |
| Example 9 | 8.2 | −1 |
| Example 10 | 8 | −1.2 |
| Example 11 | 7.6 | −1.6 |
| Example 12 | 7.1 | −2.1 |

Referring to Table 3, the buffer layers of Examples 4 to 12 are offset from the dielectric constants −9.2 of Ag of the metal layer pattern and exhibit values in the range of −2.1 to 0.6. Thereby the surface plasmon phenomenon of the buffer layer and metal layer pattern may be improved.

External Quantum Efficiency of Optoelectronic Device

Absorbance and external quantum efficiency depending on a wavelength of the optoelectronic devices according to Example 1 to 13 and Comparative Example 1 to 4 are measured. The maximum absorbance and external quantum efficiency at −3 V of the optoelectronic devices according to Example 1 and Comparative Example 1 are measured and shown in Table 4.

TABLE 4

|  | Absorbance (%) | External quantum efficiency (%, −3 V) |
| --- | --- | --- |
| Example 1 | 93 | 54 |
| Comparative Example 1 | 85 | 44 |

Referring to Table 4, the optoelectronic device according to Example 1 shows improved both absorbance and external quantum efficiency compared with the optoelectronic device according to Comparative Example 1.

While this disclosure has been described in connection with what is presently considered to be practical example embodiments, it is to be understood that inventive concepts are not limited to the disclosed embodiments, but, on the contrary, are intended to cover various modifications and equivalent arrangements included within the spirit and scope of the appended claims.

What is claimed is:

1. An optoelectronic device, comprising a first electrode and a second electrode facing each other;
   a metal layer pattern between the first electrode and the second electrode;
   a buffer layer directly on the metal layer pattern and covering the metal layer pattern; and
   a photoelectric conversion layer on the buffer layer, wherein the metal layer pattern includes a metal having a negative dielectric constant, and
   the buffer layer includes a compound selected from silicon nitride ($SiN_x$, $0<x<1$), silicon oxynitride ($SiO_yN_z$, $0<y<0.5$, $0<z\leq1$), P-doped silicon oxynitride ($SiO_yN_z$:P, $0<y<0.5$, $0<z\leq1$), and a combination thereof.

2. The optoelectronic device of claim 1, wherein the metal layer pattern includes a metal selected from Ag, Au, Co, Cu, an alloy thereof, and a mixture thereof.

3. The optoelectronic device of claim 1, wherein the metal layer pattern has a shape selected from a cylinder, a block, and a hemisphere.

4. The optoelectronic device of claim 1, wherein the metal layer pattern has a pattern size of about 5 nm to about 500 nm.

5. The optoelectronic device of claim 1, wherein the metal layer pattern includes a metal, and the metal has a dielectric constant of about −12 to about −0.1.

6. The optoelectronic device of claim 1, wherein
   the buffer layer includes a compound selected from silicon nitride ($SiN_x$, $0.2\leq x \leq0.7$), silicon oxynitride ($SiO_yN_z$, $0.05\leq y\leq0.35$, $0.2\leq z\leq0.7$), and a combination thereof.

7. The optoelectronic device of claim 1, wherein the compound of the buffer layer has a dielectric constant of about 0.1 to about 12.

8. The optoelectronic device of claim 1, wherein the metal layer pattern and the buffer layer have a sum of dielectric constants in a range of about −3.0 to about 3.0.

9. The optoelectronic device of claim 1, wherein the compound further includes phosphorus.

10. The optoelectronic device of claim 1, wherein the buffer layer has an average thickness of about 1 nm to about 30 nm.

11. The optoelectronic device of claim 1, further comprising:
    a second buffer layer, wherein
    the buffer layer is a first buffer layer, and
    the second buffer layer is between the first electrode and the photoelectric conversion layer.

12. The optoelectronic device of claim 11, wherein the second buffer layer is a hole blocking layer.

13. The optoelectronic device of claim 11, wherein
    the second buffer layer includes an inorganic oxide selected from $MoO_{x1}$ ($2.58\leq x1<3.0$), $ZnO_{x2}$ ($1.0\leq x2<2.0$), $TiO_{x3}$ ($1.5\leq x3<2.0$), $VO_{x4}$ ($1.5\leq x4<2.0$), $TaO_{x5}$ ($1.0\leq x5<2.5$), $WO_{x6}$ ($2.0<x6<3.0$), and a combination thereof.

14. The optoelectronic device of claim 1, wherein each of the first electrode and the second electrode include a metal, a metal oxide, or a combination thereof.

15. An optoelectronic device, comprising:
    a first electrode and a second electrode facing each other;
    a metal layer pattern between the first electrode and the second electrode;
    a buffer layer covering the metal layer pattern; and
    a photoelectric conversion layer on the buffer layer, wherein
    the metal layer pattern includes a metal having a negative dielectric constant, the buffer layer includes a compound selected from silicon nitride ($SiN_x$, $0<x<1$), silicon oxynitride ($SiO_yN_z$, $0<y<0.5$, $0<z\leq1$), P-doped silicon oxynitride ($SiOyNz$:P, $0<y<0.5$, $0<z\leq1$), and a combination thereof, the buffer layer includes a first electron blocking layer including silicon nitride ($SiN_x$, $0<x<1$), and the buffer layer includes a second electron blocking layer including silicon oxynitride ($SiO_yN_z$, $0<y<0.5$, $0<z\leq1$), P-doped silicon oxynitride ($SiO_yN_z$:P, $0<y<0.5$, $0<z\leq1$), or a combination thereof.

16. The optoelectronic device of claim 1, wherein the optoelectronic device is a light-emitting device, a photodetector, a memory device, or a solar cell.

17. An image sensor comprising:
the optoelectronic device of claim 1.

18. An image sensor comprising:
an optoelectronic device comprising a first electrode and a second electrode facing each other, a metal layer pattern between the first electrode and the second electrode, a buffer layer covering the metal layer pattern, and a photoelectric conversion layer on the buffer layer, wherein the metal layer pattern includes a metal having a negative dielectric constant, the buffer layer includes a compound selected from silicon nitride ($SiN_x$, $0<x<1$), silicon oxynitride ($SiO_yN_z$, $0<y<0.5$, $0<z\leq1$), P-doped silicon oxynitride ($SiO_yN_z$:P, $0<y<0.5$, $0<z\leq1$), and a combination thereof, the image sensor includes a semiconductor substrate integrated with a plurality of first photo-sensing devices sensing light in a blue wavelength region and a plurality of second photo-sensing devices sensing light in a red wavelength region, the optoelectronic device is on the semiconductor substrate, the optoelectronic device selectively absorbs light in a green wavelength region, and the optoelectronic device is an organic optoelectronic device.

19. The image sensor of claim 18, further comprising:
a color filter layer on the semiconductor substrate, wherein the color filter layer includes a blue filter for selectively absorbing light in a blue wavelength region and a red filter for selectively absorbing light in a red wavelength region.

20. The image sensor of claim 18, wherein the first photo-sensing devices and the second photo-sensing devices are stacked in a vertical direction in the semiconductor substrate.

21. The image sensor of claim 17, wherein
the image sensor includes a green photoelectric device for selectively absorbing light in a green wavelength region, a blue photoelectric device for selectively absorbing light in a blue wavelength region, and a red photoelectric device for selectively absorbing light in a red wavelength region, and the green photoelectric device, the blue photoelectric device, and the red photoelectric device are stacked.

22. An electronic device comprising:
the image sensor of claim 17.

* * * * *